US012677715B2

(12) United States Patent
Xue et al.

(10) Patent No.: US 12,677,715 B2
(45) Date of Patent: Jul. 7, 2026

(54) APPARATUS HAVING SURFACE MOUNT PACKAGES HAVING CO-PACKED FIELD EFFECT TRANSISTORS

(71) Applicant: ALPHA AND OMEGA SEMICONDUCTOR INTERNATIONAL LP, Toronto (CA)

(72) Inventors: Yan Xun Xue, Los Gatos, CA (US); Madhur Bobde, Sunnyvale, CA (US); Long-Ching Wang, Cupertino, CA (US); Jian Yin, San Ramon, CA (US); Lin Chen, San Jose, CA (US); Ziwei Yu, Cupertino, CA (US); Xiaobin Wang, San Jose, CA (US); Zhiqiang Niu, Santa Clara, CA (US); Kuan-Hung Li, Zhubei (TW)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 484 days.

(21) Appl. No.: 18/378,503

(22) Filed: Oct. 10, 2023

(65) Prior Publication Data

US 2025/0118638 A1     Apr. 10, 2025

(51) Int. Cl.
*H10W 90/00*     (2026.01)
*H10W 70/40*     (2026.01)
*H10W 74/10*     (2026.01)
*H10W 72/00*     (2026.01)

(52) U.S. Cl.
CPC ........ *H10W 90/811* (2026.01); *H10W 70/417* (2026.01); *H10W 70/481* (2026.01); *H10W 74/111* (2026.01); *H10W 72/886* (2026.01); *H10W 90/736* (2026.01); *H10W 90/766* (2026.01)

(58) Field of Classification Search
CPC .................................................. H10W 90/811
See application file for complete search history.

(56) References Cited

U.S. PATENT DOCUMENTS

| 7,915,721 B2 | 3/2011 | Liu et al. | |
| 9,029,995 B2 | 5/2015 | Funatsu et al. | |
| 9,754,864 B1 | 9/2017 | Xue | |
| 9,837,380 B2 * | 12/2017 | Tan ..................... | H10W 74/114 |
| 9,842,797 B2 * | 12/2017 | Carpenter ........... | H10W 90/811 |
| 9,881,853 B2 * | 1/2018 | Ahlers ................ | H10W 90/811 |
| 9,966,328 B2 | 5/2018 | Xue | |

(Continued)

FOREIGN PATENT DOCUMENTS

TW          201613244 A     4/2016

*Primary Examiner* — Hung V Ngo
(74) *Attorney, Agent, or Firm* — Chen-Chi Lin

(57)     ABSTRACT

A semiconductor package comprises a first device and a second device. The structure of the first semiconductor device is similar to that of the second semiconductor device. The first semiconductor device comprises a lead frame strip, a first plurality of field effect transistors (FETs), a first plurality of clips, a second plurality of FETs, a second plurality of clips, and a first molding encapsulation. A method is applied to fabricate a plurality of semiconductor packages. The method comprises the steps of providing a lead frame strip, attaching a first plurality of FETs, attaching a first plurality of clips, attaching a second plurality of FETs, attaching a second plurality of clips, and forming a molding encapsulation.

26 Claims, 19 Drawing Sheets

(56)     References Cited

U.S. PATENT DOCUMENTS

| | | | |
|---|---|---|---|
| 10,204,847 B2 * | 2/2019 | Cho | .................... H10W 70/481 |
| 11,742,268 B2 | 8/2023 | Fang et al. | |
| 11,798,882 B2 | 10/2023 | Upadhyaya | |
| 2021/0082790 A1 | 3/2021 | Zhang et al. | |
| 2021/0343630 A1 | 11/2021 | Xue | |
| 2023/0223320 A1 | 7/2023 | Yandoc et al. | |

* cited by examiner

300

382R    384R    398    386R    A

A'

393    395    391    397

380    382    384    386    381

366G 360    362    364    366

340    342    344    346

320    322    324    326

314S   314P   314G    316S   316P   316G 312P   312G

312S 310    312D    312    314    314D    316    316D

798

921

940

942          944          946

941

960

962    964    966

961

960

979

982    984    986

APPARATUS HAVING SURFACE MOUNT PACKAGES HAVING CO-PACKED FIELD EFFECT TRANSISTORS

FIELD OF THE INVENTION

This invention relates generally to a semiconductor package having co-packed field effect transistors (FETs) and apparatus contains semiconductor packages. More particularly, the present invention relates to a surface mount semiconductor package having co-packed FETs.

BACKGROUND OF THE INVENTION

Conventional motor drive and power tool includes two groups of transistors. Each of the two groups of transistors include six transistors. For applying surface mount technology, the two groups of transistors occupy a large portion of a top surface of a printed circuit board.

The instant application co-packed FETs in a semiconductor package thereby occupying less top surface of a printed circuit board while applying surface mount technology. The semiconductor package includes clips to facilitate high current and low impedance application.

SUMMARY OF THE INVENTION

The present invention discloses a semiconductor apparatus comprises a first device and a second device. The structure of the first semiconductor device is similar to that of the second semiconductor device. The first semiconductor device comprises a lead frame strip, a first plurality of field effect transistors (FETs), a first plurality of clips, a second plurality of FETs, a second plurality of clips, and a first molding encapsulation.

A method for fabricating a plurality of semiconductor packages is also disclosed. The method comprises the steps of providing a lead frame strip, attaching a first plurality of FETs, attaching a first plurality of clips, attaching a second plurality of FETs, attaching a second plurality of clips, and forming a molding encapsulation.

DETAILED DESCRIPTION OF THE INVENTION

Figure 1A:
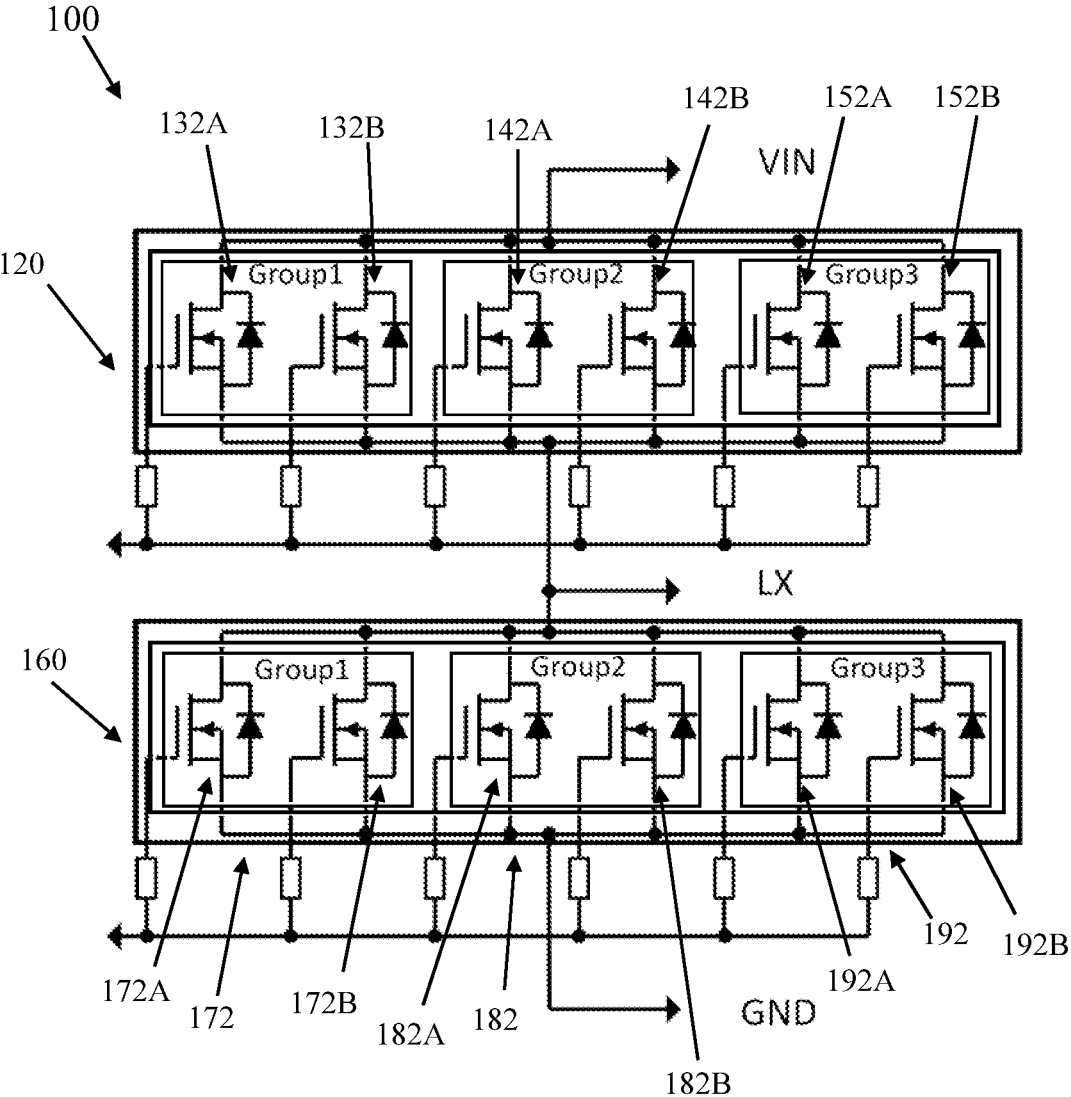
FIG. 1A is a circuit diagram and FIG. 1B is a device and circuit diagram of a semiconductor apparatus in examples of the present disclosure.
Figure 1B:
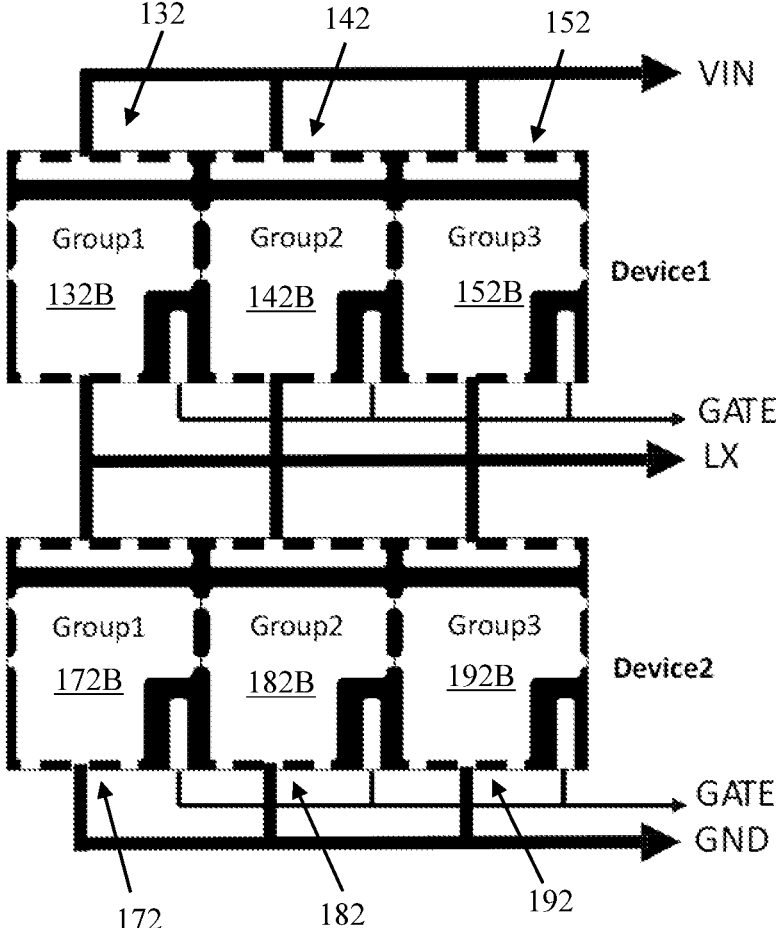

FIG. 1A is a circuit diagram and FIG. 1B is a device and circuit diagram of a semiconductor apparatus 100 in examples of the present disclosure. In one example, the semiconductor apparatus 100 includes a surface mount package. The semiconductor apparatus 100 comprises a first device 120 that is a packaged device and a second device 160 that is a packaged device. In one example, the first device 120 is made of the semiconductor packaged device 300 of FIG. 3A. In another example, the second device 160 is made of the semiconductor packaged device 300 of FIG. 3A. The first device 120 comprises a plurality of FETs. Though three pairs of FETs (pair 132, pair 142, and pair 152) are shown in FIG. 1A, the number of pairs of FETs included in the first device 120 may vary. The pair 132 comprises FET 132A and FET 132B. The pair 142 comprises FET 142A and FET 142B. The pair 152 comprises FET 152A and FET 152B. A respective drain electrode of each of FET 132A, FET 132B, FET 142A, FET 142B, FET 152A, and FET 152B are electrically connected. The second device 160 comprises a plurality of FETs. Though three pairs of FETs (pair 172, pair 182, and pair 192) are shown in FIG. 1A, the number of pairs of FETs included in the second device 160 may vary. The pair 172 comprises FET 172A and FET 172B. The pair 182 comprises FET 182A and FET 182B. The pair 192 comprises FET 192A and FET 192B. A respective drain electrode of each of FET 172A, FET 172B, FET 182A, FET 182B, FET 192A, and FET 192B are electrically connected.

FIG. 1B shows that FET 132B is stacked on top of FET 132A. FET 142B is stacked on top of FET 142A. FET 152B is stacked on top of FET 152A. FET 172B is stacked on top of FET 172A. FET 182B is stacked on top of FET 182A. FET 192B is stacked on top of FET 192A.

Figure 2A:
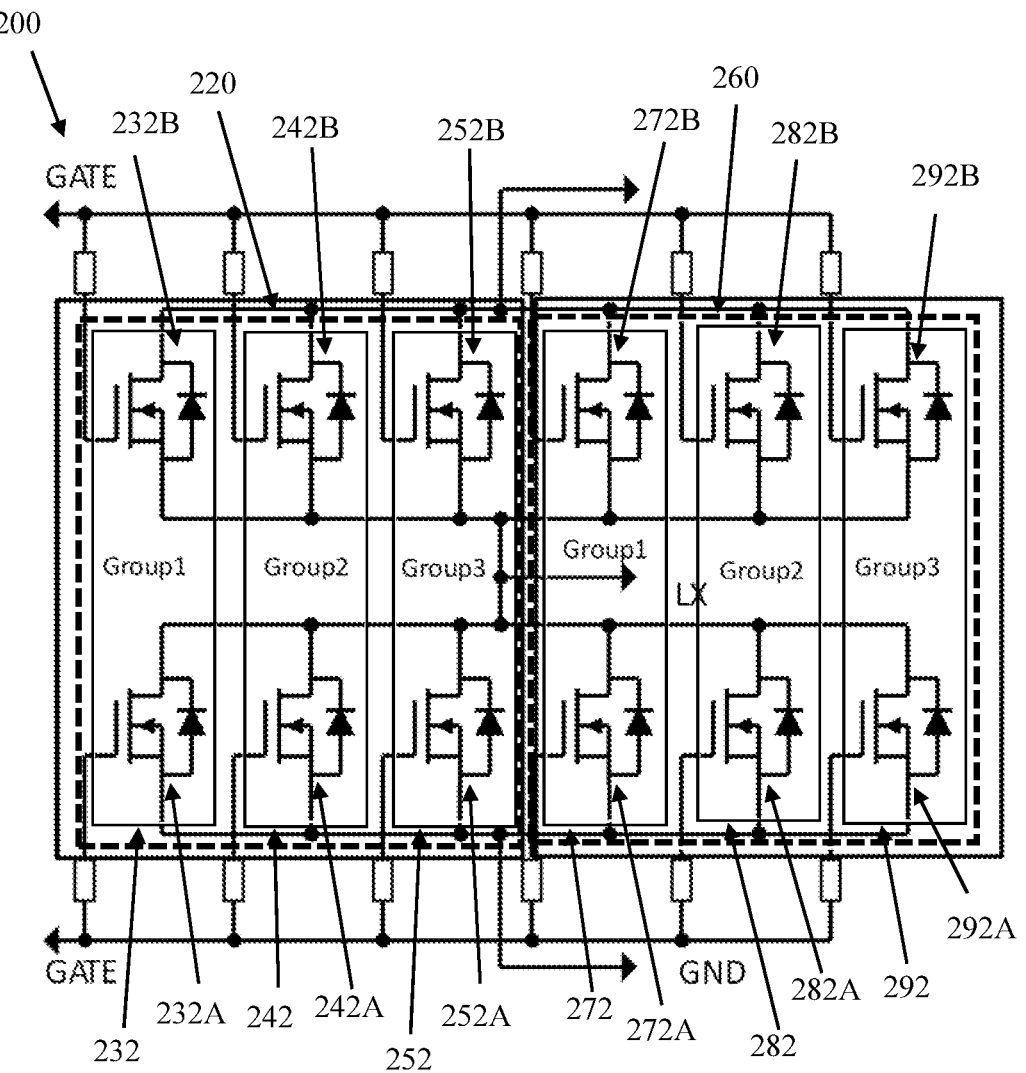
FIG. 2A is a circuit diagram and FIG. 2B is a device and circuit diagram of another semiconductor apparatus in examples of the present disclosure.
Figure 2B:
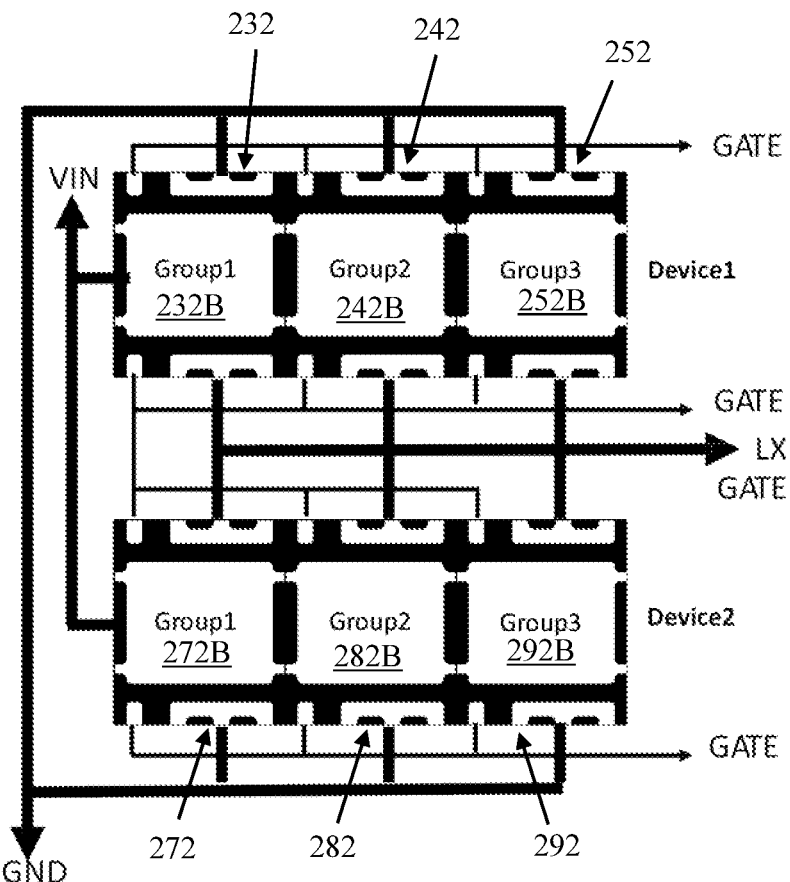

FIG. 2A is a circuit diagram and FIG. 2B is a device and circuit diagram of a semiconductor apparatus 200 in examples of the present disclosure. The semiconductor apparatus 200 comprises a first device 220 and a second device 260. In one example, the first device 220 is made of the semiconductor packaged device 400 of FIG. 4A. In another example, the second device 260 is made of the semiconductor packaged device 400 of FIG. 4A. The first device 220 comprises a plurality of FETs. Though three pairs of FETs (pair 232, pair 242, and pair 252) are shown in FIG. 2A, the number of pairs of FETs included in the first device 220 may vary. The pair 232 comprises FET 232A and FET 232B. The pair 242 comprises FET 242A and FET 242B. The pair 252 comprises FET 252A and FET 252B. A drain electrode of FET 232A is electrically connected to a source electrode of FET 232B. A drain electrode of FET 242A is electrically connected to a source electrode of FET 242B. A drain electrode of FET 252A is electrically connected to a source electrode of FET 252B. The second device 260 comprises a plurality of FETs. Though three pairs of FETs (pair 272, pair 282, and pair 292) are shown in FIG. 2A, the number of pairs of FETs included in the second device 260 may vary. The pair 272 comprises FET 272A and FET 272B. The pair 282 comprises FET 282A and FET 282B. The pair 292 comprises FET 292A and FET 292B. A drain electrode of FET 272A is electrically connected to a source electrode of FET 272B. A drain electrode of FET 282A is electrically connected to a source electrode of FET 282B. A drain electrode of FET 292A is electrically connected to a source electrode of FET 292B.

FIG. 2B shows that FET 232B is stacked on top of FET 232A. FET 242B is stacked on top of FET 242A. FET 252B is stacked on top of FET 252A. FET 272B is stacked on top of FET 272A. FET 282B is stacked on top of FET 282A. FET 292B is stacked on top of FET 292A.

Figures 3A, 3B:
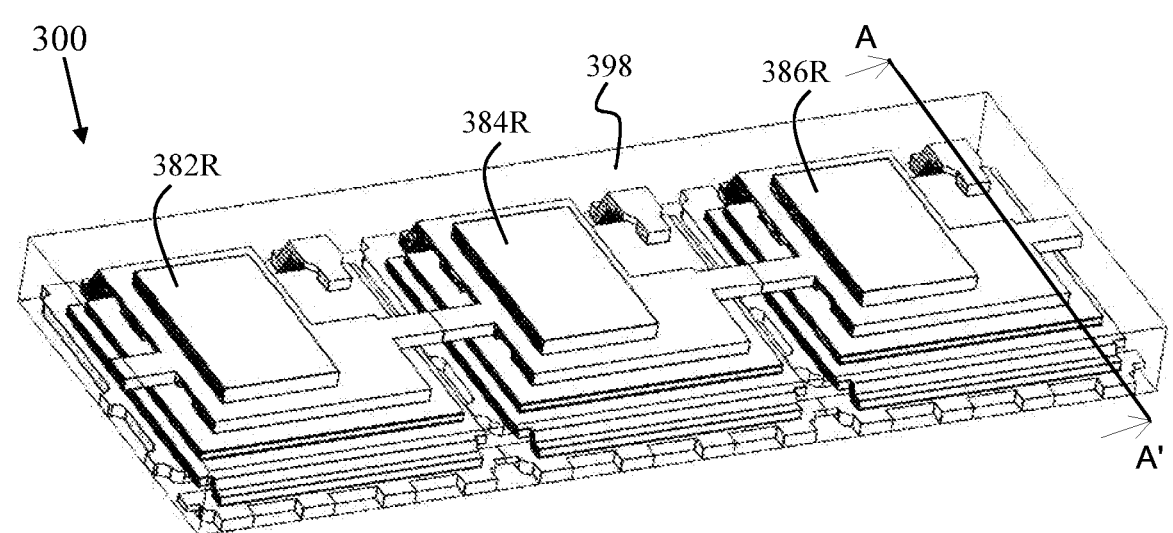
FIG. 3A is an isotropic view.
FIG. 3B is an exploded plot.
Figure 3C:
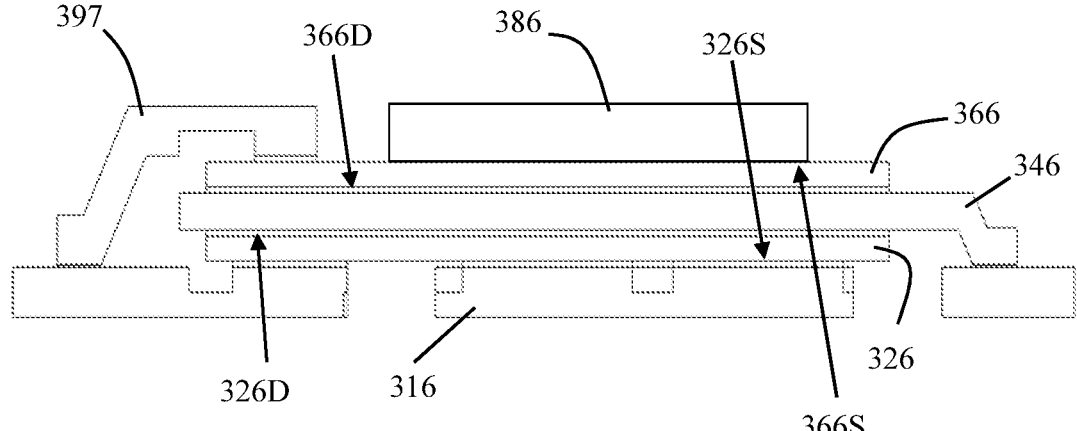
FIG. 3C is a cross sectional view along AA' of FIG. 3A of a semiconductor packaged device in examples of the present disclosure.

FIG. 3A is an isotropic view, FIG. 3B is an exploded plot, and FIG. 3C is a cross sectional view along AA' of FIG. 3A of a semiconductor packaged device 300 in examples of the present disclosure. The semiconductor packaged device 300 comprises a lead frame strip 310, a first plurality of FETs 320, a first plurality of clips 340, a second plurality of FETs 360, a second plurality of clips 380, and a first molding encapsulation 398. The lead frame strip 310 comprises a first plurality of lead frame units. Though three lead frame units (lead frame unit 312, lead frame unit 314, and lead frame unit 316) are shown in FIG. 3A, the number of lead frame units included in the semiconductor packaged device 300 may vary. As shown, each lead frame unit 312, 314, and 316 includes a die paddle 312P, 314P and 316P, a first lead 312D, 314D and 316D on a first side of a respective die paddle, a second lead 312S, 314S and 316S on a second side of the respective die paddle opposite the first side, and a third lead 312G, 314G and 316G on the second side of respective die paddle. In one example, the die paddle of each lead frame unit is mechanically and electrically connected to the die paddle of adjacent lead frame unit. In another example, the first lead of each lead frame unit is mechanically and electrically connected to the first lead of adjacent lead frame unit. In another example, the second lead of each lead frame unit is mechanically and electrically connected to the die paddle of respective lead frame unit. Each of the first plurality of FETs 320 is attached to a respective die paddle of the lead frame unit of the lead frame strip 310. FET 322 is attached to lead frame unit 312. FET 324 is attached to lead frame unit 314. FET 326 is attached to lead frame unit 316.

The first plurality of clips 340 are attached to the first plurality of FETs 320. Each of the first plurality of clips 340 is attached to a respective FET of the first plurality of FETs 320 to connect a surface electrode to a respective first lead. Clip 342 is attached to FET 322. Clip 344 is attached to FET 324. Clip 346 is attached to FET 326.

The second plurality of FETs 360 are attached to top surfaces of the first plurality of clips 340. Each of the second plurality of FETs 360 is attached to a respective clip of the first plurality of clips 340. FET 362 is attached to clip 342. FET 364 is attached to clip 344. FET 366 is attached to clip 346.

The second plurality of clips 380 are attached to the second plurality of FETs 360. The second plurality of clips 380 comprises an interconnected clip 381 and a plurality of gate clips 391. The interconnected clip 381 comprises clip 382, clip 384, and clip 386. Clip 382 comprises a raised portion 382R. Clip 384 comprises a raised portion 384R. Clip 386 comprises a raised portion 386R. Clip 382 is attached to FET 362. Clip 384 is attached to FET 364. Clip 386 is attached to FET 366. The plurality of gate clips 391 comprises gate clip 393, gate clip 395, and gate clip 397.

The molding encapsulation 398 encloses the first plurality of FETs 320, the first plurality of clips 340, the second plurality of FETs 360, a majority portion of the second plurality of clips 380, and a majority portion of the lead frame strip 310. A majority portion refers to larger than 50%.

Each FET of the first plurality of FETs 320 and the second plurality of FETs 360 comprises: a respective source electrode (for example, source electrode 326S of FET 326 and source electrode 366S of FET 366) and a respective gate electrode (for example, gate electrode 366G of FET 366) on a top surface of said each FET; and a respective drain electrode (for example, drain electrode 326D of FET 326 and drain electrode 366D of FET 366) on a bottom surface of said each FET. The first plurality of FETs 320 are flipped so that the drain electrode of each FET of the first plurality of FETs 320 is electrically connected to the drain electrode of a respective FET of the second plurality of FETs 360. For example, the drain electrode 326D of FET 326 is electrically connected to the drain electrode 366D of FET 366 by clip 346.

The interconnected clip 381 electrically connects the source electrode (for example, source electrode 366S of FET 366) of each FET of the second plurality of FETs 360 to a corresponding second lead. In one example, each one of the interconnected clips is mechanically and electrically connected an adjacent interconnected clip of the second plurality of the clips.

Each of the plurality of gate clips 391 electrically connects the gate electrode of a respective FET of the second plurality of FETs 360 to a corresponding third lead. For example, gate clip 397 is electrically connected to the gate electrode 366G of FET 366.

Figure 4A:
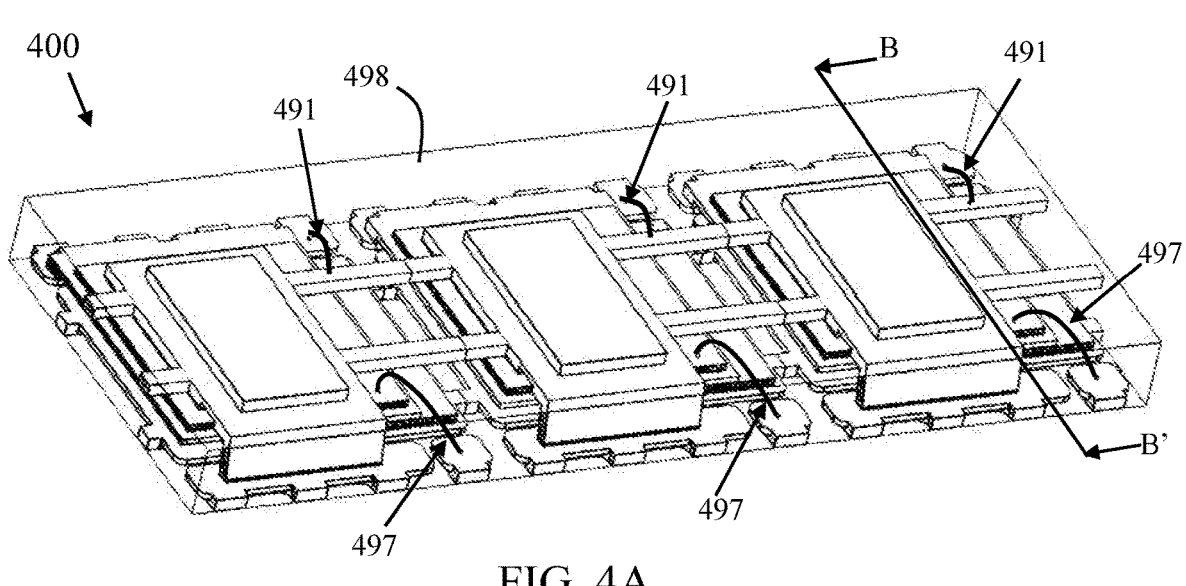
FIG. 4A is an isotropic view.
Figure 4B:
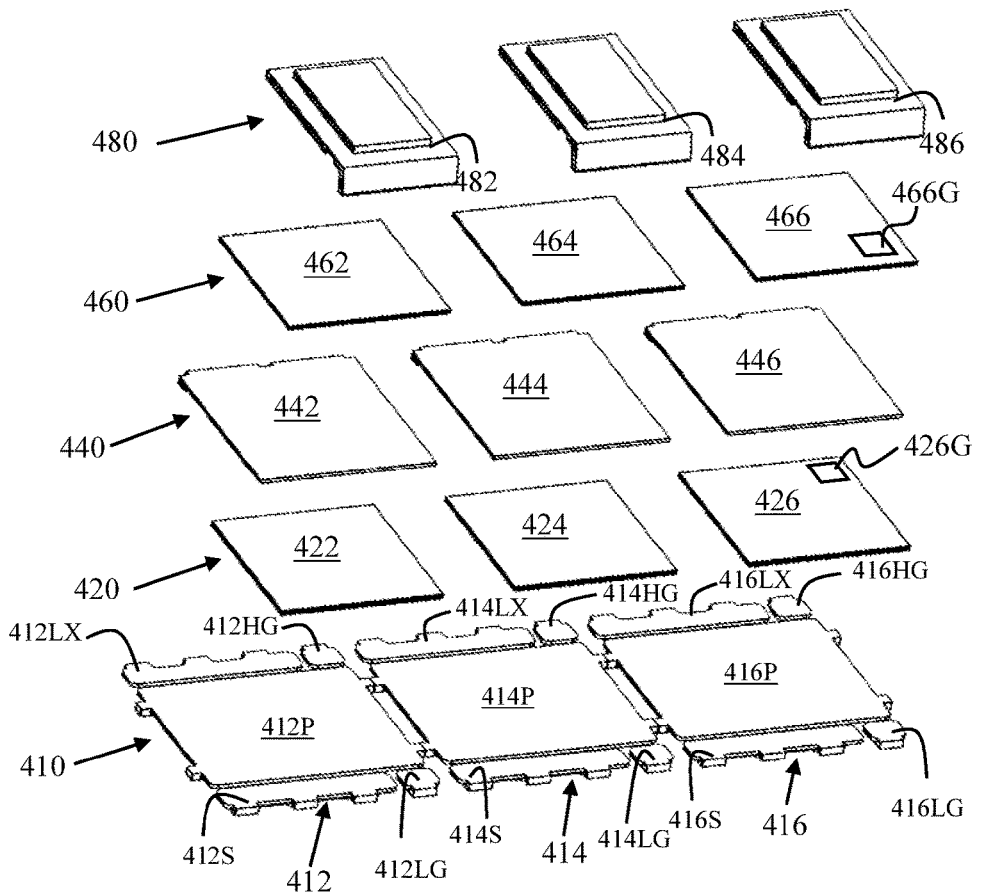
FIG. 4B is an exploded plot.
Figure 4C:
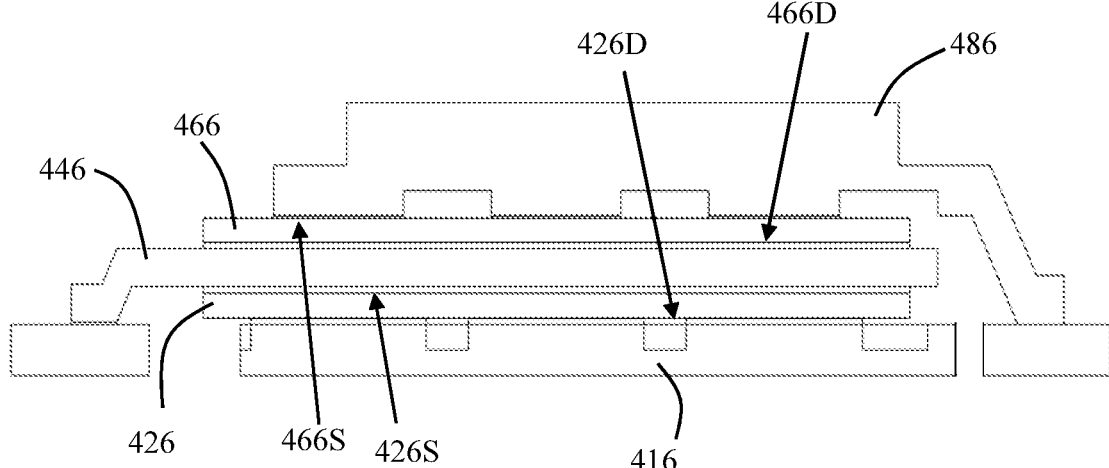
FIG. 4C is a cross sectional view along BB' of FIG. 4A of another semiconductor packaged device in examples of the present disclosure.

FIG. 4A is an isotropic view, FIG. 4B is an exploded plot, and FIG. 4C is a cross sectional view along BB' of FIG. 4A of a semiconductor packaged device 400 in examples of the present disclosure. The semiconductor packaged device 400 comprises a lead frame strip 410, a first plurality of FETs 420, a first plurality of clips 440, a second plurality of FETs 460, a second plurality of clips 480, and a first molding encapsulation 498. The lead frame strip 410 comprises a first plurality of lead frame units. Though three lead frame units (lead frame unit 412, lead frame unit 414, and lead frame unit 416) are shown in FIG. 4A, the number of lead frame units included in the semiconductor packaged device 400 may vary. As shown, each lead frame unit 412, 414 and 416 includes a die paddle 412P, 414P and 416P, a first lead 412LX, 414LX and 416LX on a first side of a respective die paddle, a second lead 412S, 414S and 416S on a second side of the respective die paddle opposite the first side, a third lead 412LG, 414LG and 416LG on the second side of respective die paddle and a fourth lead 412HG, 414HG and 416HG on the first side of respective die paddle. In one example, the die paddle of each lead frame unit is mechanically and electrically connected to the die paddle of adjacent lead frame unit. The first lead, the second lead, the third lead and the fourth lead in each lead frame unit are separated from each other and are isolated from the die paddle of the unit.

Each of the first plurality of FETs 420 is attached to a die pad of respective lead frame unit of the lead frame strip 410. FET 422 is attached to lead frame unit 412. FET 424 is attached to lead frame unit 414. FET 426 is attached to lead frame unit 416.

The first plurality of clips 440 are attached to the first plurality of FETs 420. Each of the first plurality of clips 440 is attached to a respective FET of the first plurality of FETs 420 to connect a surface electrode to a respective first lead.

Clip 442 is attached to FET 422. Clip 444 is attached to FET 424. Clip 446 is attached to FET 426.

The second plurality of FETs 460 are attached to top surfaces of the first plurality of clips 440. Each of the second plurality of FETs 460 is attached to a respective clip of the first plurality of clips 440. FET 462 is attached to clip 442. FET 464 is attached to clip 444. FET 466 is attached to clip 446.

The second plurality of clips 480 are attached to the second plurality of FETs 460. The second plurality of clips 480 comprises clip 482, clip 484, and clip 486. Clip 482 is attached to FET 462. Clip 484 is attached to FET 464. Clip 486 is attached to FET 466.

The molding encapsulation 498 encloses the first plurality of FETs 420, the first plurality of clips 440, the second plurality of FETs 460, a majority portion of the second plurality of clips 480, and a majority portion of the lead frame strip 410. A majority portion refers to larger than 50%.

Each FET of the first plurality of FETs 420 and the second plurality of FETs 460 comprises: a respective source electrode (for example, source electrode 426S of FET 426 and source electrode 466S of FET 466) and a respective gate electrode (for example, gate electrode 466G of FET 466) on a top surface of said each FET; and a respective drain electrode (for example, drain electrode 426D of FET 426 and drain electrode 466D of FET 466) on a bottom surface of said each FET. The source electrode of each FET of the first plurality of FETs 420 is electrically connected to the drain electrode of a respective FET of the second plurality of FETs 460. For example, the source electrode 426S of FET 426 is electrically connected to the drain electrode 466D of FET 466 by clip 446.

The second plurality of clips 480 electrically connects the source electrode (for example, source electrode 466S of FET 466) of each FET of the second plurality of FETs 460 to a corresponding second lead. In one example, each one of the second plurality of clips is mechanically and electrically connected an adjacent ones of the second plurality of the clips.

The semiconductor packaged device 400 further comprises a plurality of bond wires 491 connect the gate electrode of each FET of the first plurality of FETs to a corresponding third lead and a plurality of bond wires 497 connect the gate electrode of each FET of the second plurality of FETs to a corresponding third lead. For example, bond wire 491 connects the gate electrode 426G of FET 426 to the fourth lead 416HG, and bond wire 497 connects the gate electrode 466G of FET 466 to the third lead 416LG.

Figure 5A:
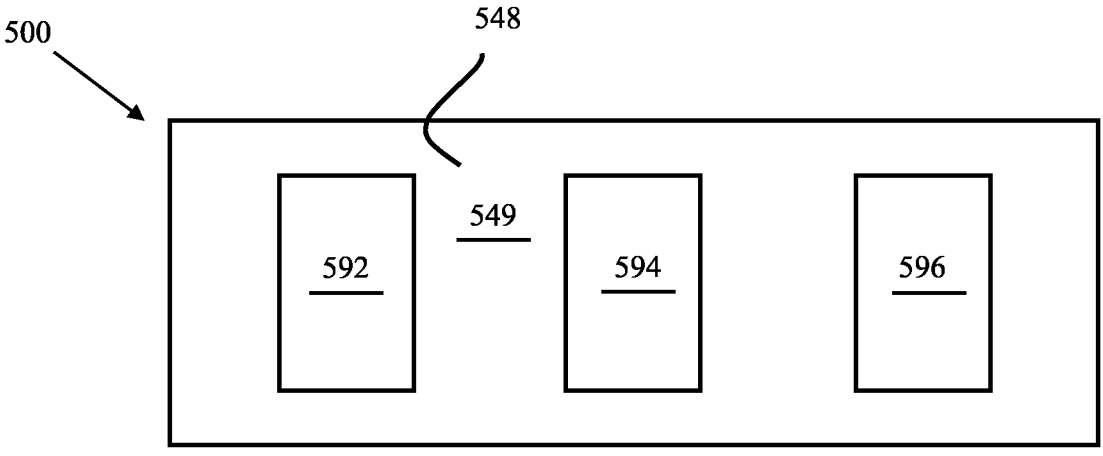
FIG. 5A is a top view of a semiconductor package in examples of the present disclosure.

FIG. 5A is a top view of a semiconductor package 500 in examples of the present disclosure. A respective top surface of each of the second plurality of clips is exposed from a top surface 549 of the molding encapsulation 548. Referring now to FIG. 3A and FIG. 5A, top surface 592 of the raised portion 382R of clip 382, top surface 594 of the raised portion 384R of clip 384, and top surface 596 of the raised portion 386R of clip 386 are exposed from the top surface 549 of the first molding encapsulation 548. The exposed top surface 592, exposed top surface 594, and exposed top surface 592 improve heat dissipation.

Figure 5B:
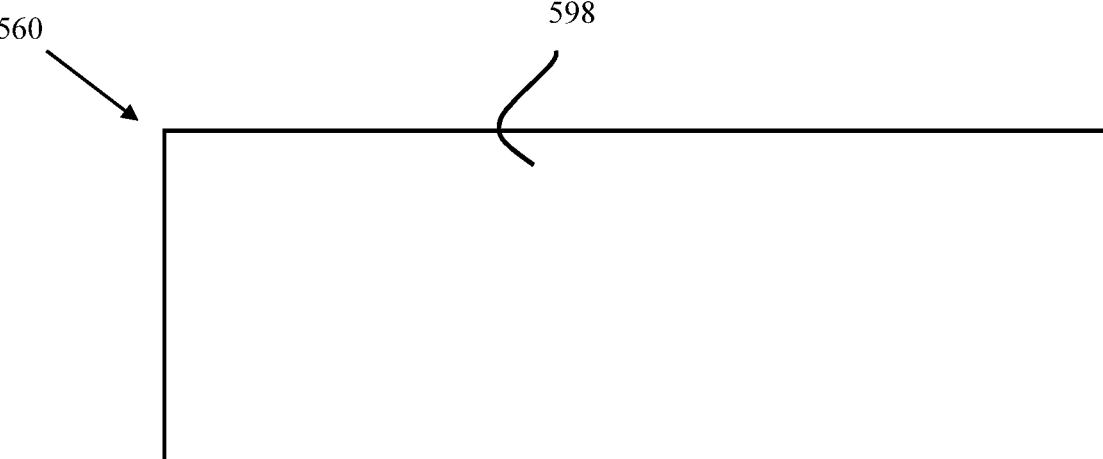
FIG. 5B is a top view of another semiconductor package in examples of the present disclosure.

FIG. 5B is a top view of a semiconductor package 560 in examples of the present disclosure. A respective top surface of each of the second plurality of clips is not exposed from a top surface of the molding encapsulation 598.

Figure 6:
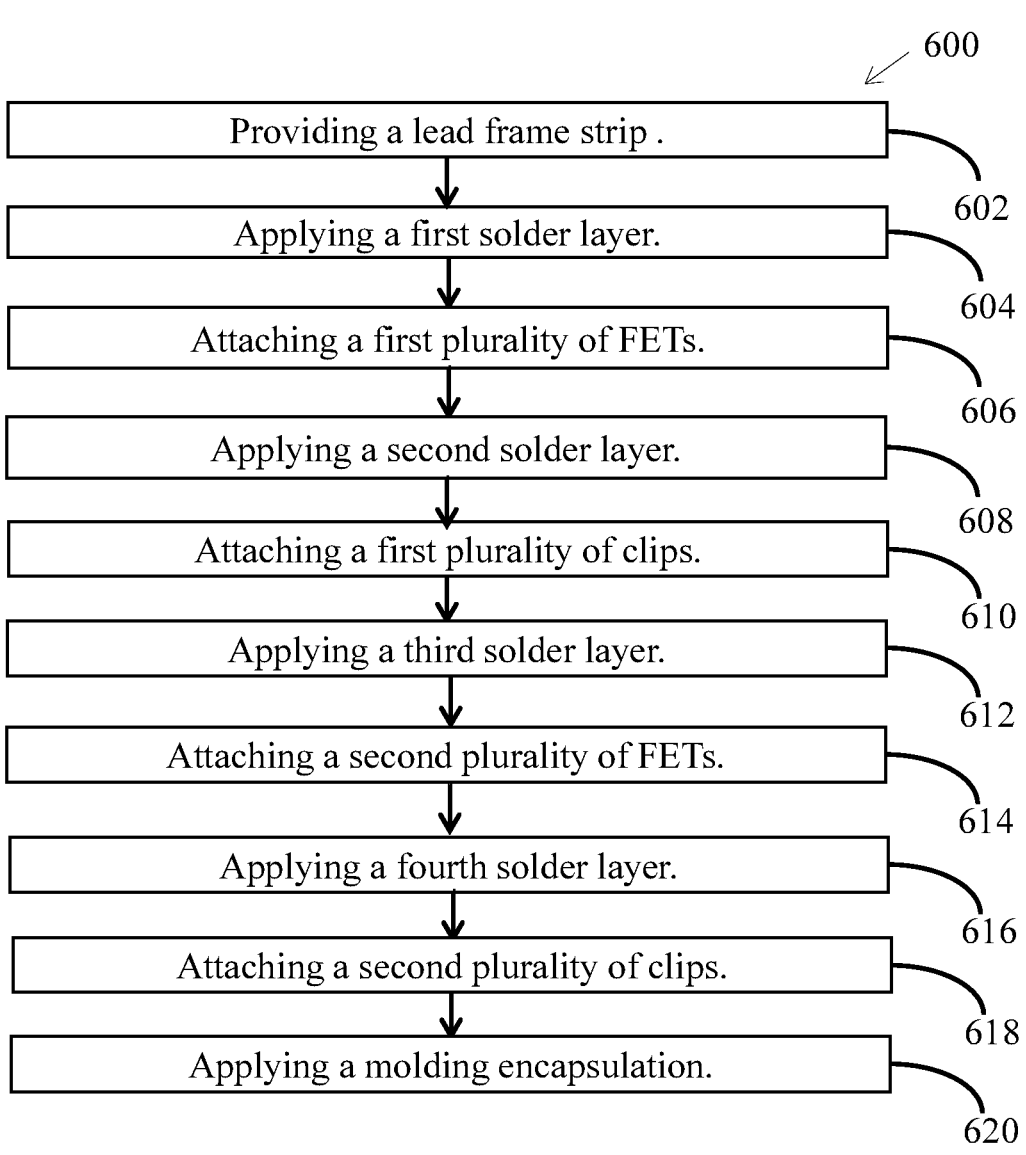
FIG. 6 is a flowchart of a process to develop a plurality of semiconductor packages in examples of the present disclosure.

FIG. 6 is a flowchart of a process 600 to develop a plurality of semiconductor packages in examples of the present disclosure. The process 600 may start from block 602. FIGS. 7A-7J show the isotropic views of the corresponding steps. For simplicity, only one semiconductor device is shown in FIGS. 7A-7J.

Figure 7A:
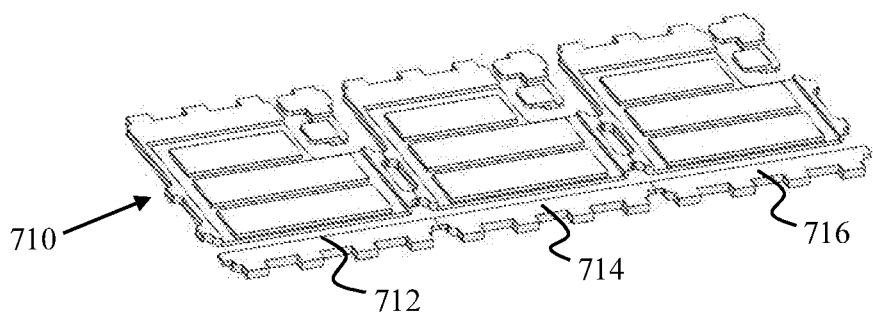
FIGS. 7A, 7B, 7C, 7D, 7E, 7F, 7G, 7H, 7I and 7J show the steps of the process to fabricate the plurality of semiconductor packages of FIG. 6 in examples of the present disclosure.

In block 602, referring now to FIG. 7A, a lead frame strip 710 is provided. In one example, the lead frame strip 710 comprises a first plurality of lead frame units. Though three lead frame units (lead frame unit 712, lead frame unit 714, and lead frame unit 716) are shown in FIG. 7A, the number of lead frame units included in a semiconductor device may vary. Block 602 may be followed by block 604.

Figure 7B:
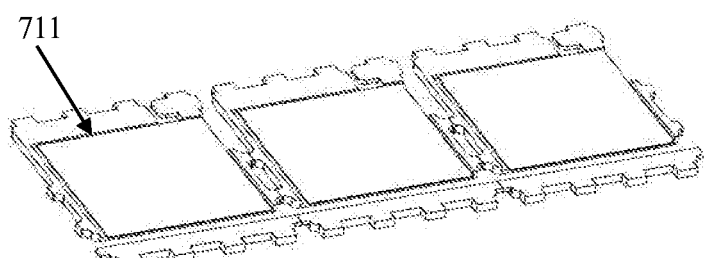

In block 604, referring now to FIG. 7B, a first solder layer 711 is applied. In examples of the present disclosure, the first solder layer 711 is applied by solder print. Block 604 may be followed by block 606.

Figure 7C:
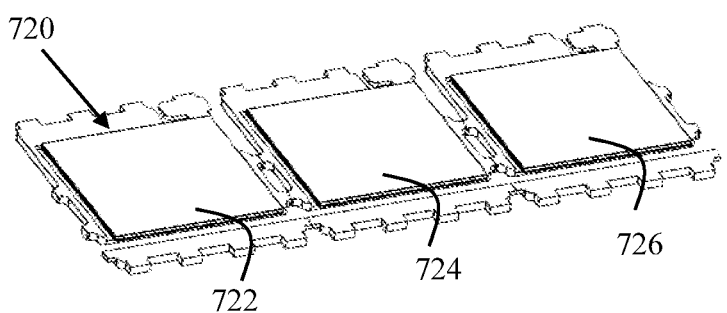

In block 606, referring now to FIG. 7C, a first plurality of FETs 720 are attached to the lead frame strip 710. Each of the first plurality of FETs 720 is attached to a respective lead frame unit of the lead frame strip 710. FET 722 is attached to lead frame unit 712 by the first solder layer 711. FET 724 is attached to lead frame unit 714 by the first solder layer 711. FET 726 is attached to lead frame unit 716 by the first solder layer 711. Block 606 may be followed by block 608.

Figure 7D:
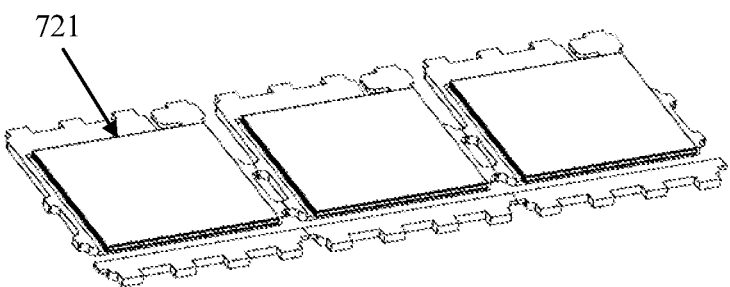

In block 608, referring now to FIG. 7D, a second solder layer 721 is applied. In examples of the present disclosure, the second solder layer 721 is applied by solder dispense. Block 608 may be followed by block 610.

Figure 7E:
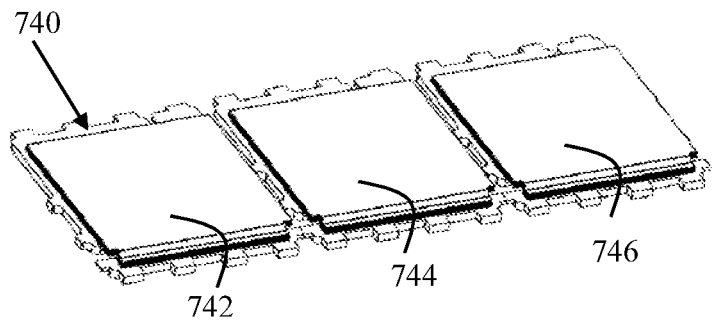

In block 610, referring now to FIG. 7E, a first plurality of clips 740 are attached to the first plurality of FETs 720. Each of the first plurality of clips 740 is attached to a respective FET of the first plurality of FETs 720. Clip 742 is attached to FET 722 by the second solder layer 721. Clip 744 is attached to FET 724 by the second solder layer 721. Clip 746 is attached to FET 726 by the second solder layer 721. Block 610 may be followed by block 612.

Figure 7F:
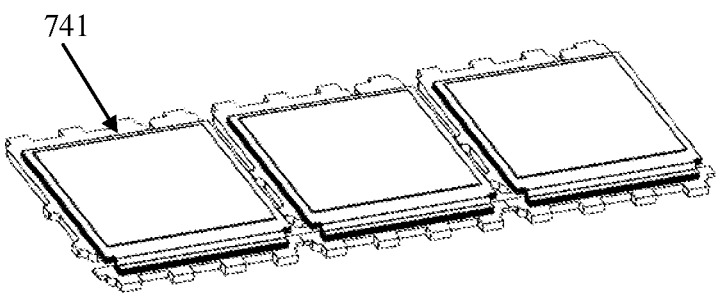

In block 612, referring now to FIG. 7F, a third solder layer 741 is applied. In examples of the present disclosure, the third solder layer 741 is applied by solder dispense. Block 612 may be followed by block 614.

Figure 7G:
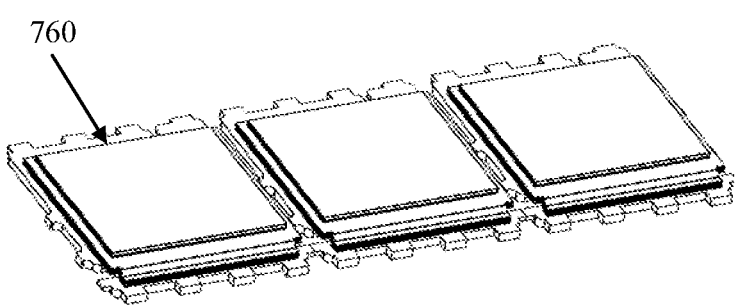

In block 614, referring now to FIG. 7G, a second plurality of FETs 760 are attached to the first plurality of clips 740. Each of the second plurality of FETs 760 is attached to a respective clip of the first plurality of clips 740. FET 762 is attached to clip 742 by the third solder layer 741. FET 764 is attached to clip 744 by the third solder layer 741. FET 766 is attached to clip 746 by the third solder layer 741. Block 614 may be followed by block 616.

Figure 7H:
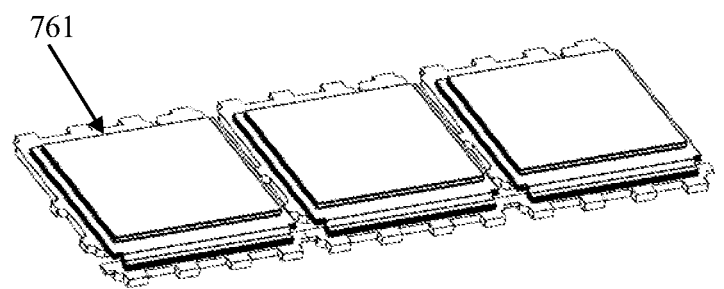

In block 616, referring now to FIG. 7H, a fourth solder layer 761 is applied. In examples of the present disclosure, the fourth solder layer 761 is applied by solder dispense. Block 616 may be followed by block 618.

Figure 7I:
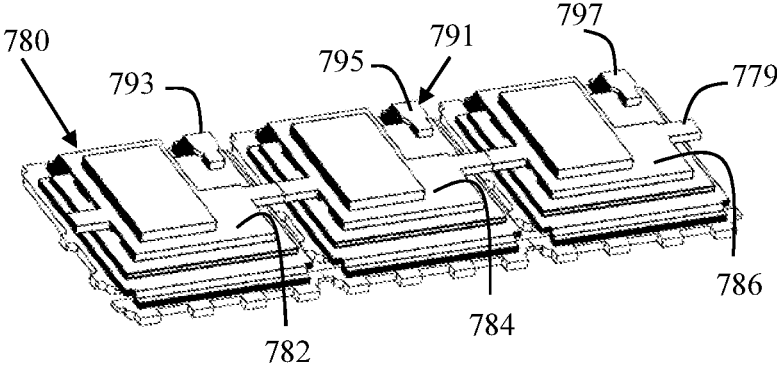

In block 618, referring now to FIG. 7I, a second plurality of clips 780 are attached to the second plurality of FETs 760. The second plurality of clips 780 comprises an interconnected clip 779 and a plurality of gate clips 791. The interconnected clip 779 comprises clip 782, clip 784, and clip 786. Clip 782 is attached to FET 762 by the fourth solder layer 781. Clip 784 is attached to FET 764 by the fourth solder layer 781. Clip 786 is attached to FET 766 by the fourth solder layer 781. The plurality of gate clips 391 comprises gate clip 393, gate clip 395, and gate clip 397. Block 618 may be followed by block 620.

Figure 7J:
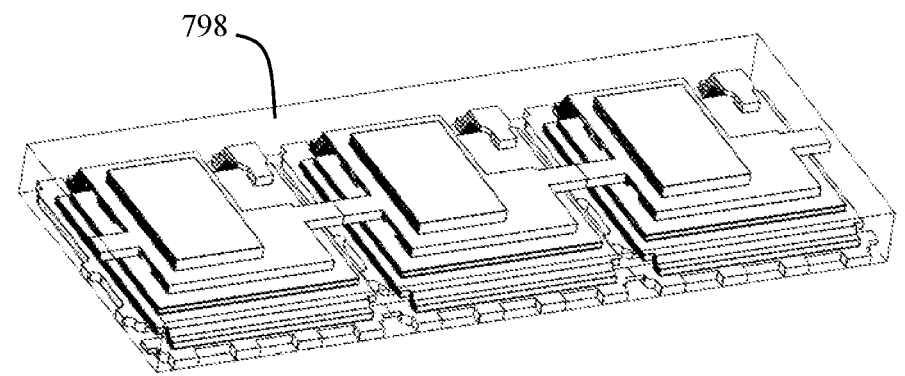

In block 620, referring now to FIG. 7J, a molding encapsulation 798 is formed. The molding encapsulation 798 encloses the first plurality of FETs 720, the first plurality of clips 740, the second plurality of FETs 760, a majority portion of the second plurality of clips 780, and a majority portion of the lead frame strip 710. Block 620 may be followed by a singulation process forming the plurality of semiconductor packaged devices 300.

Figure 8:
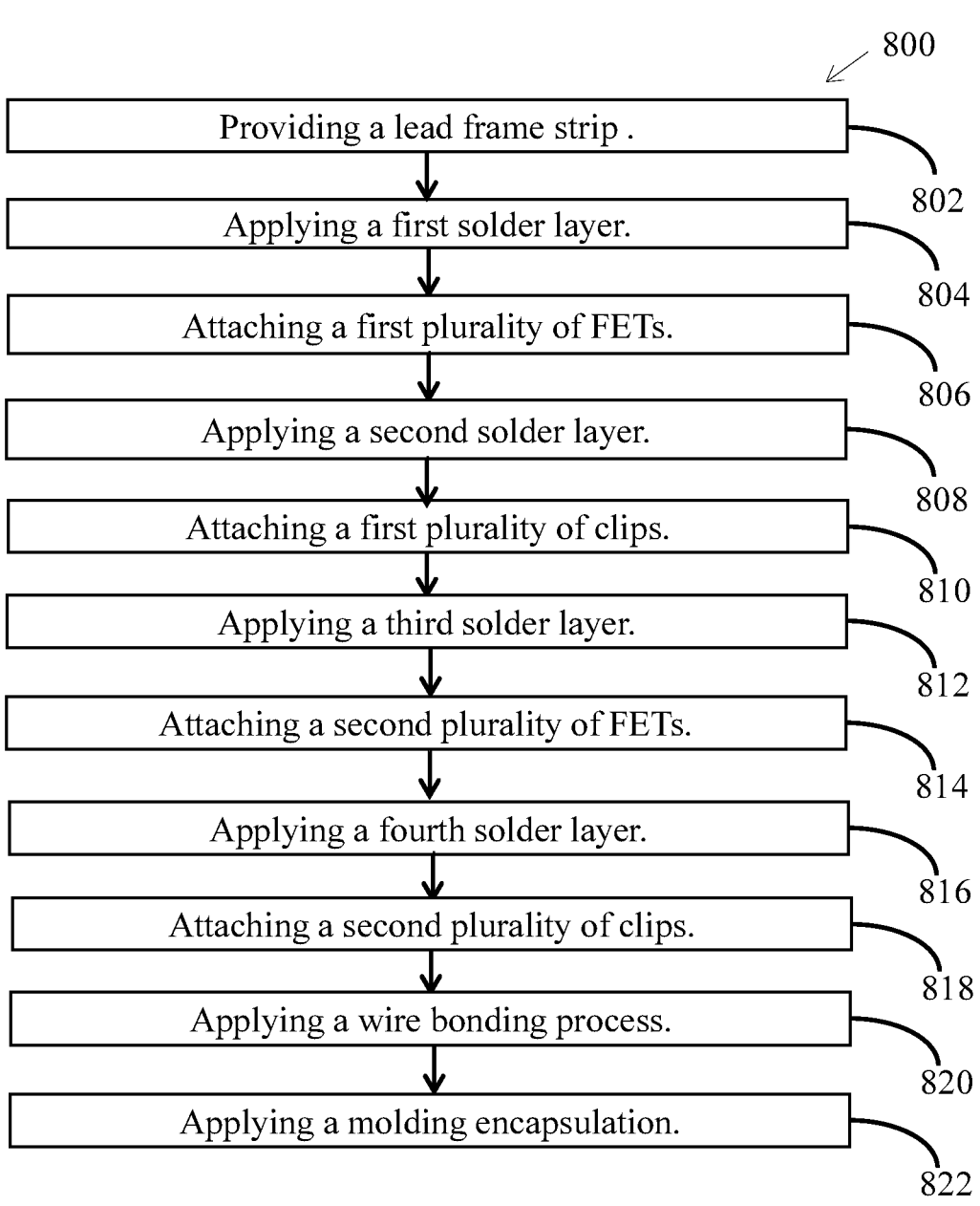
FIG. 8 is a flowchart of a process to develop another plurality of semiconductor packages in examples of the present disclosure.

FIG. 8 is a flowchart of a process 800 to develop a plurality of semiconductor packages in examples of the present disclosure. The process 800 may start from block 802. FIGS. 9A-9K show the isotropic views of the corresponding steps. For simplicity, only one semiconductor device is shown in FIGS. 9A-9K.

Figure 9A:
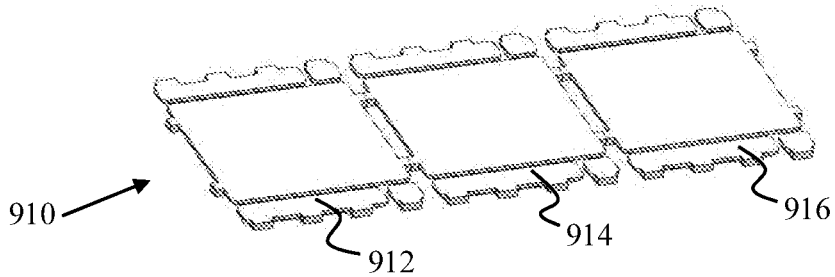
FIGS. 9A, 9B, 9C, 9D, 9E, 9F, 9G, 9H, 9I, 9J, and 9K show the steps of the process to fabricate the plurality of semiconductor packages of FIG. 8 in examples of the present disclosure.

In block 802, referring now to FIG. 9A, a lead frame strip 910 is provided. In one example, the lead frame strip 910 comprises a first plurality of lead frame units. Though three lead frame units (lead frame unit 912, lead frame unit 914, and lead frame unit 916) are shown in FIG. 9A, the number of lead frame units included in a semiconductor device may vary. Block 802 may be followed by block 804.

Figure 9B:
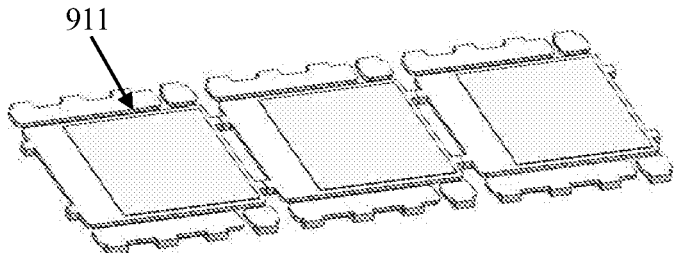

In block 804, referring now to FIG. 9B, a first solder layer 911 is applied. In examples of the present disclosure, the first solder layer 911 is applied by solder print. Block 804 may be followed by block 806.

Figure 9C:
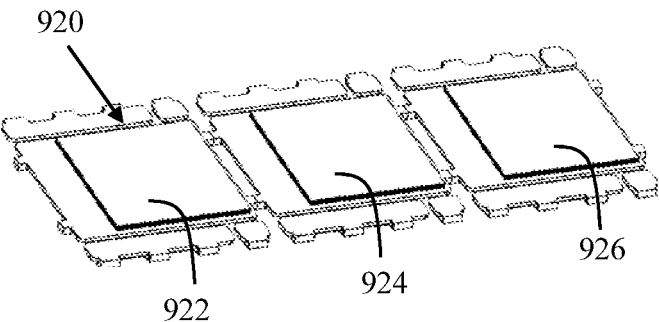

In block 806, referring now to FIG. 9C, a first plurality of FETs 920 are attached to the lead frame strip 910. Each of the first plurality of FETs 920 is attached to a respective lead frame unit of the lead frame strip 910. FET 922 is attached to lead frame unit 912 by the first solder layer 911. FET 924 is attached to lead frame unit 914 by the first solder layer 911. FET 926 is attached to lead frame unit 916 by the first solder layer 911. Block 806 may be followed by block 808.

Figure 9D:
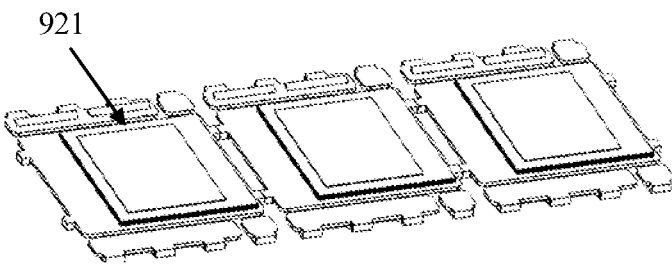

In block 808, referring now to FIG. 9D, a second solder layer 921 is applied. In examples of the present disclosure, the second solder layer 921 is applied by solder dispense. Block 808 may be followed by block 810.

Figure 9E:
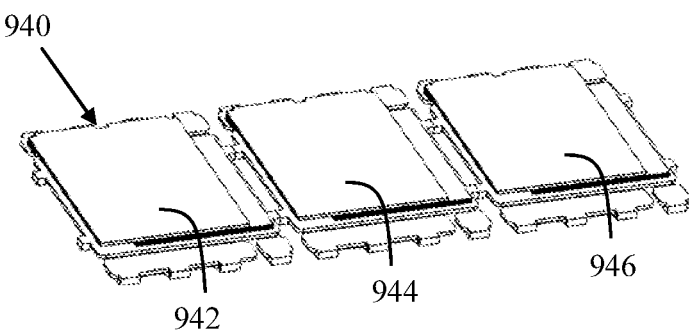

In block 810, referring now to FIG. 9E, a first plurality of clips 940 are attached to the first plurality of FETs 920. Each of the first plurality of clips 940 is attached to a respective FET of the first plurality of FETs 920. Clip 942 is attached to FET 922 by the second solder layer 921. Clip 944 is attached to FET 924 by the second solder layer 921. Clip 946 is attached to FET 926 by the second solder layer 921. Block 810 may be followed by block 812.

Figure 9F:
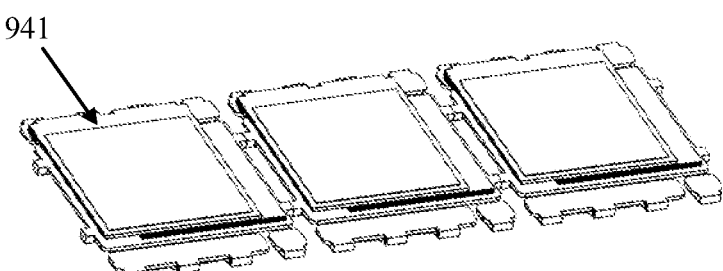

In block 812, referring now to FIG. 9F, a third solder layer 941 is applied. In examples of the present disclosure, the third solder layer 941 is applied by solder dispense. Block 812 may be followed by block 814.

Figure 9G:
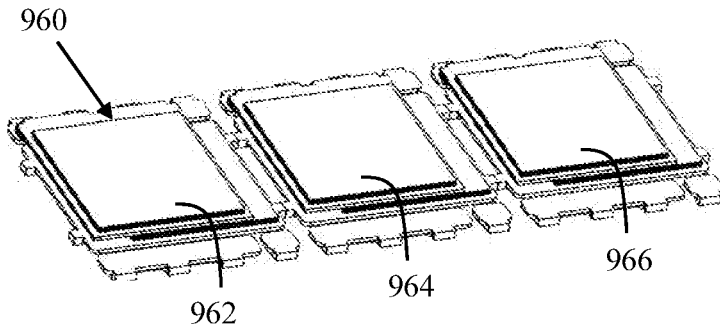

In block 814, referring now to FIG. 9G, a second plurality of FETs 960 are attached to the first plurality of clips 940. Each of the second plurality of FETs 960 is attached to a respective clip of the first plurality of clips 940. FET 962 is attached to clip 942 by the third solder layer 941. FET 964 is attached to clip 944 by the third solder layer 941. FET 966 is attached to clip 946 by the third solder layer 941. Block 814 may be followed by block 816.

Figure 9H:
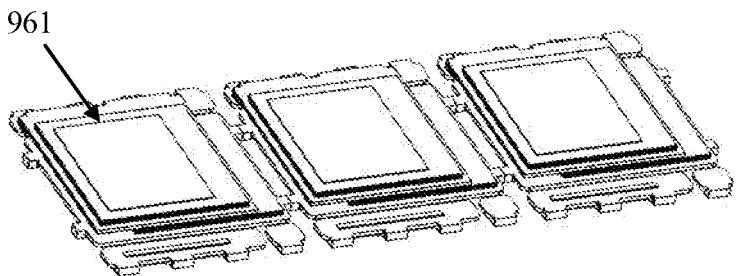

In block 816, referring now to FIG. 9H, a fourth solder layer 961 is applied. In examples of the present disclosure, the fourth solder layer 961 is applied by solder dispense. Block 816 may be followed by block 818.

Figure 9I:
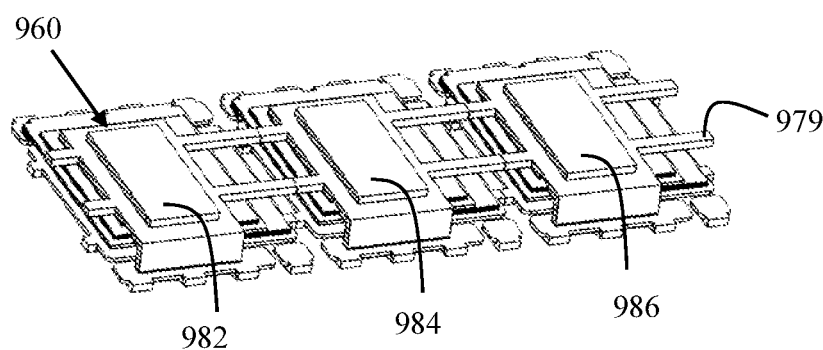

In block 818, referring now to FIG. 9I, a second plurality of clips 980 are attached to the second plurality of FETs 960. The second plurality of clips 980 comprises an interconnected clip 979. The interconnected clip 979 comprises clip 982, clip 984, and clip 986. Clip 982 is attached to FET 962 by the fourth solder layer 981. Clip 984 is attached to FET 964 by the fourth solder layer 981. Clip 986 is attached to FET 966 by the fourth solder layer 981. Block 818 may be followed by block 820.

Figure 9J:
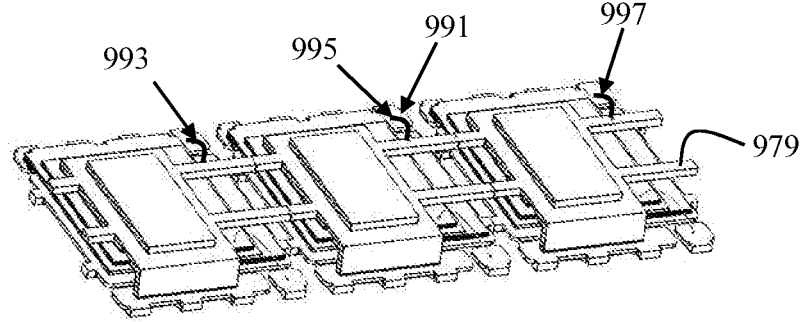

In block 820, referring now to FIG. 9J, a plurality of bond wires 991 connect the gate electrode of each FET of the second plurality of FETs 960 to the interconnected clip 979.

The plurality of bond wires 991 comprises bond wire 993, bond wire 995, and bond wire 997. For example, bond wire 997 connects the gate electrode of FET 966 to the interconnected clip 979. Block 820 may be followed by block 822.

Figure 9K:
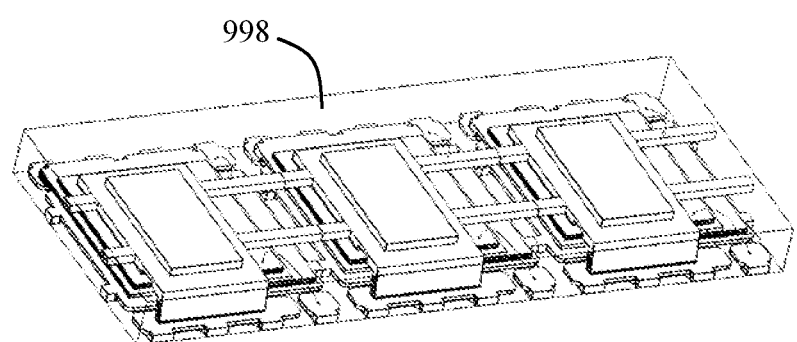

In block 822, referring now to FIG. 9K, a molding encapsulation 998 is formed. The molding encapsulation 998 encloses the first plurality of FETs 920, the first plurality of clips 940, the second plurality of FETs 960, a majority portion of the second plurality of clips 980, and a majority portion of the lead frame strip 910. Block 822 may be followed by a singulation process forming the plurality of semiconductor packaged devices 400.

Those of ordinary skill in the art may recognize that modifications of the embodiments disclosed herein are possible. For example, a number of FETs included in a device may vary. Other modifications may occur to those of ordinary skill in this art, and all such modifications are deemed to fall within the purview of the present invention, as defined by the claims.

The invention claimed is:

1. A semiconductor package comprising:
  a lead frame comprising:
    a plurality of lead frame units, each lead frame unit comprising:
      a die paddle,
      a first lead disposed on a first side of the die paddle,
      a second lead disposed on a second side of the die paddle, the second side being opposite the first side, and
      a third lead disposed on the second side of the die paddle, the die paddle of each lead frame unit of the plurality of lead frame units being mechanically and electrically connected to the die paddle of a respective, adjacent lead frame unit of the plurality of lead frame units;
  a first plurality of field effect transistors (FETs) each attached to a respective die paddle of the lead frame;
  a first plurality of clips each having
    a first end attached to a top surface electrode of the first FETs, and
    a second end attached to the first lead of a respective lead frame unit;
  a second plurality of FETs each attached to a top surface of the first clips;
  a second plurality of clips each having
    a first end attached to a top surface electrode of the second FETs, and
    a second end attached to a respective second lead; and
  a molding encapsulation enclosing the first plurality of FETs, the first plurality of clips, the second plurality of FETs, a majority portion of the second plurality of clips, and a majority portion of the lead frame.

2. The semiconductor package of claim 1, wherein each of the second plurality of clips is mechanically and electrically connected to a respective, adjacent clip of the second plurality of clips.

3. The semiconductor package of claim 1, wherein the first lead of each lead frame unit is separated from the die paddle of said each lead frame unit; and wherein the first lead of each lead frame unit is mechanically and electrically connected to the first lead of a respective, adjacent lead frame unit.

4. The semiconductor package of claim 3, wherein each of the first FETs is flipped and mounted on the respective die paddle; wherein each of the first FETs comprises a source electrode connected to the respective die paddle and a gate electrode connected to the third lead.

5. The semiconductor package of claim 4, wherein each of the second FETs comprises a bottom drain electrode connected to one of the first clips, a top source electrode connected to one of the second clips, and a top gate electrode connected to the third lead, wherein the second lead is mechanically and electrically connected to the die paddle of the respective lead frame unit.

6. The semiconductor package of claim 5, wherein a respective top surface of each of the second plurality of clips is exposed from a top surface of the molding encapsulation.

7. The semiconductor package of claim 1, wherein each lead frame unit further comprises a fourth lead disposed on the first side of the die paddle, the fourth lead being adjacent the first lead, wherein the first lead, the second lead, the third lead, and the fourth lead in each lead frame unit are separated from one another, and are isolated from the die paddle of said each lead frame unit.

8. The semiconductor package of claim 7, wherein each of the first FETs comprises a bottom drain electrode connected to the respective die paddle.

9. The semiconductor package of claim 8, wherein each of the second FETs comprises a bottom drain electrode connected to one of the first clips, a top source electrode connected to one of the second clips, and a top gate electrode connected to the third lead.

10. The semiconductor package of claim 9, wherein a respective top surface of each of the second plurality of clips is exposed from a top surface of the molding encapsulation.

11. A semiconductor apparatus comprising:

a first device comprising:

a first lead frame comprising a first one or more lead frame units;

a first one or more field effect transistors (FETs) each attached to a respective lead frame unit of the first lead frame;

a first one or more clips attached to the first one or more FETs;

a second one or more FETs attached to the first one or more clips;

a second one or more clips attached to the second one or more FETs; and a first molding encapsulation enclosing the first one or more FETs, the first one or more clips, the second one or more FETs, a majority portion of the second one or more clips, and a majority portion of the first lead frame; and a second device comprising:

a second lead frame comprising a second one or more lead frame units;

a third one or more FETs each attached to a respective lead frame unit of the second lead frame;

a third one or more clips attached to the third one or more FETs;

a fourth one or more FETs attached to third one or more clips;

a fourth one or more clips attached to the fourth one or more FETs; and a second molding encapsulation enclosing the third one or more FETs, the third one or more clips, the fourth one or more FETs, a majority portion of the fourth one or more clips, and a majority portion of the second lead frame.

12. The semiconductor apparatus of claim 11, wherein each FET of the first one or more FETs, the second one or more FETs, the third one or more FETs, and the fourth one or more FETs comprises:

a respective source electrode and a respective gate electrode on a top surface of said each FET; and a respective drain electrode on a bottom surface of said each FET;

wherein the first one or more FETs are flipped so that the drain electrode of each FET of the first one or more FETs is electrically connected to the drain electrode of a respective FET of the second one or more FETs; and wherein the third one or more FETs are flipped so that the drain electrode of each FET of the third one or more FETs is electrically connected to the drain electrode of a respective FET of the fourth one or more FETs.

13. The semiconductor apparatus of claim 12, wherein the second one or more clips comprises:

a first interconnected clip electrically connected to the source electrode of each FET of the second one or more FETs; and a first one or more gate clips each electrically connected to the gate electrode of a respective FET of the second one or more FETs; and wherein the fourth one or more clips comprises a second interconnected clip electrically connected to the source electrode of each FET of the fourth one or more FETs; and a second one or more gate clips each electrically connected to the gate electrode of a respective FET of the fourth one or more FETs.

14. The semiconductor apparatus of claim 13, wherein a respective top surface of each of the second one or more clips is exposed from a top surface of the first molding encapsulation; and wherein a respective top surface of each of the fourth one or more clips is exposed from a top surface of the second molding encapsulation.

15. The semiconductor apparatus of claim 14, wherein the first one or more FETs comprises:

a first FET;

a second FET; and a third FET;

wherein the second one or more FETs comprises:

a fourth FET;

a fifth FET; and a sixth FET;

wherein the third one or more FETs comprises:

a seventh FET;

an eighth FET; and a ninth FET; and wherein the fourth one or more FETs comprises:

a tenth FET;

an eleventh FET; and a twelfth FET.

16. The semiconductor apparatus of claim 11, wherein each FET of the first one or more FETs, the second one or more FETs, the third one or more FETs, and the fourth one or more FETs comprises:

a respective source electrode and a respective gate electrode on a top surface of said each FET; and a respective drain electrode on a bottom surface of said each FET;

wherein the source electrode of each FET of the first one or more FETs is electrically connected to the drain electrode of a respective FET of the second one or more FETs; and wherein the source electrode of each FET of the third one or more FETs is electrically connected to the drain electrode of a respective FET of the fourth one or more FETs.

17. The semiconductor apparatus of claim 16, wherein the second one or more clips comprises:

a first interconnected clip electrically connected to the source electrode of each FET of the second one or more FETs;

wherein the fourth one or more clips comprises a second interconnected clip electrically connected to the source electrode of each FET of the fourth one or more FETs.

18. The semiconductor apparatus of claim 17, wherein a respective top surface of each of the second one or more clips is exposed from a top surface of the first molding encapsulation; and wherein a respective top surface of each of the fourth one or more clips is exposed from a top surface of the second molding encapsulation.

19. The semiconductor apparatus of claim 18, wherein a first one or more bond wires connect the gate electrode of each FET of the second one or more FETs to the first interconnected clip; and a second one or more bond wires connect the gate electrode of each FET of the fourth one or more FETs to the second interconnected clip.

20. The semiconductor apparatus of claim 18, wherein the first one or more FETs comprises:

a first FET;

a second FET; and a third FET;

wherein the second one or more FETs comprises:

a fourth FET;

a fifth FET; and a sixth FET;

wherein the third one or more FETs comprises:

a seventh FET;

an eighth FET; and a ninth FET; and wherein the fourth one or more FETs comprises:

a tenth FET;

an eleventh FET; and a twelfth FET.

21. A semiconductor package comprising:

a lead frame comprising:

one or more lead frame units, each lead frame unit comprising:

a die paddle, a first lead disposed on a first side of the die paddle, a second lead disposed on a second side of the die paddle, the second side being opposite the first side, and a third lead;

one or more first field effect transistors (FETs) each being flipped and attached to a respective die paddle of the one or more lead frame units, wherein each of the one or more first FETs comprises a source electrode connected to the respective die paddle, and a gate electrode connected to a respective third lead of the one or more lead frame units;

one or more first clips each comprising:

a first end attached to a drain electrode of the one or more first FETs, and a second end attached to the first lead of a respective lead frame unit of the one or more lead frame units;

one or more second FETs each comprising:

a drain electrode attached to a top surface of the one or more first clips, a source electrode electrically connected to a respective second lead of the one or more lead frame units, and a gate electrode electrically connected to the respective third lead of the one or more lead frame units; and a molding encapsulation enclosing the one or more first FETs, the one or more first clips, the one or more second FETs, and a majority portion of the lead frame.

22. The semiconductor package of claim 21, wherein each of the third lead of the one or more lead frame units is disposed on the second side of the respective die paddle.

23. The semiconductor package of claim 21, wherein the second lead of the one or more lead frame units is mechanically and electrically connected to the die paddle of the respective lead frame unit.

24. The semiconductor package of claim 21 further comprising one or more second clips each comprising:

a first end connected to the source electrode of a respective second FET of the one or more second FETs; and a second end connected to the respective second lead of the one or more lead frame units.

25. The semiconductor package of claim 24, wherein a top surface of each of the one or more second clips is exposed from a top surface of the molding encapsulation.

26. The semiconductor package of claim 24 further comprising one or more gate clips each comprising:

a first end connected to the gate electrode of the respective second FET of the one or more second FETs; and a second end connected to the respective third lead of the one or more lead frame units.

* * * * *